(12) United States Patent
Lin et al.

(10) Patent No.: US 8,934,261 B2
(45) Date of Patent: Jan. 13, 2015

(54) COMPACT DEVICE HOUSING AND ASSEMBLY TECHNIQUES THEREFOR

(75) Inventors: Wey-Jiun Lin, Los Altos Hills, CA (US); Kevin Pan, Nanshan District (CN); Conrado Sacluti de la Cruz, Rizal (PH)

(73) Assignee: Apple Inc., Cupertino, CA (US)

( * ) Notice: Subject to any disclaimer, the term of this patent is extended or adjusted under 35 U.S.C. 154(b) by 456 days.

(21) Appl. No.: 12/489,429

(22) Filed: Jun. 23, 2009

(65) Prior Publication Data

US 2010/0159755 A1    Jun. 24, 2010

Related U.S. Application Data

(60) Provisional application No. 61/140,599, filed on Dec. 23, 2008.

(51) Int. Cl.
| | |
|---|---|
| H05K 1/11 | (2006.01) |
| H05K 1/14 | (2006.01) |
| H01R 13/11 | (2006.01) |
| H01R 12/00 | (2006.01) |
| H01R 13/66 | (2006.01) |

(Continued)

(52) U.S. Cl.
CPC ............. *H01R 13/111* (2013.01); *H01R 9/091* (2013.01); *H01R 13/6675* (2013.01); *H05K 1/141* (2013.01); *H01R 12/57* (2013.01); *H05K 1/145* (2013.01); *H05K 3/366* (2013.01); *H05K 2201/048* (2013.01); *H05K 2201/09181* (2013.01); *H05K 2201/10189* (2013.01)
USPC ............ 361/792; 361/752; 361/753; 361/803

(58) Field of Classification Search
USPC ............ 361/752–753, 792, 803; 439/76.1, 65
See application file for complete search history.

(56) References Cited

U.S. PATENT DOCUMENTS

| | | | |
|---|---|---|---|
| 1,169,532 | A | 1/1916 | Denhard |
| 1,526,353 | A | 2/1925 | Livingston |

(Continued)

FOREIGN PATENT DOCUMENTS

| | | |
|---|---|---|
| CN | 2178392 | 9/1994 |
| CN | 2257965 | 7/1997 |

(Continued)

OTHER PUBLICATIONS

Non-Final Office Action for U.S. Appl. No. 12/135,044, mailed on Jul. 8, 2009, 7 pages.

(Continued)

*Primary Examiner* — Tuan T Dinh
(74) *Attorney, Agent, or Firm* — Kilpatrick Townsend & Stockton LLP

(57) ABSTRACT

High density electronic device assemblies and techniques for forming high density electronic device assemblies are disclosed. These assemblies and techniques can be used to form compact electronic devices. In one embodiment, substrate arrangements that include a multiple-part substrate can be used to form a high density electronic device assembly. In another embodiment, one or more clips can be used in a high density electronic device assembly to provide mechanical and electrical interconnection between electrical structures that are to be removably coupled together as parts of the high density electronic device assembly. In still another embodiment, a removable cap (and a method for forming the removable cap) can be used for an electronic device housing.

16 Claims, 12 Drawing Sheets

(51) Int. Cl.
*H01R 12/57* (2011.01)
*H05K 3/36* (2006.01)

(56) References Cited

U.S. PATENT DOCUMENTS

| | | |
|---|---|---|
| 1,914,944 A | 6/1933 | Reuben |
| 2,007,848 A | 7/1935 | Cromartie |
| 2,027,447 A | 1/1936 | Percy |
| 2,030,856 A | 2/1936 | Dillig |
| 2,291,837 A | 8/1942 | Joseph |
| 2,484,004 A | 10/1949 | Adams |
| 2,537,370 A | 1/1951 | Parnes |
| 2,692,373 A | 10/1954 | Werner et al. |
| 2,947,914 A | 8/1960 | Simons |
| 3,315,217 A | 4/1967 | Bird |
| 3,636,495 A | 1/1972 | Forsyth, Jr. |
| 3,878,489 A | 4/1975 | Rothweiler |
| 4,028,654 A | 6/1977 | Bullard et al. |
| 2,762,026 A | 5/1980 | Friedrich |
| 4,205,291 A | 5/1980 | Flentge |
| 4,375,308 A | 3/1983 | Wilkinson |
| 4,519,015 A | 5/1985 | Lin |
| 4,573,104 A | 2/1986 | Kamada |
| 4,697,863 A | 10/1987 | Galloway et al. |
| 4,758,921 A | 7/1988 | Hung |
| 4,808,115 A * | 2/1989 | Norton et al. .................... 439/79 |
| 4,858,071 A * | 8/1989 | Manabe et al. ............... 361/720 |
| 3,501,582 A | 3/1990 | Heidler et al. |
| 4,939,623 A | 7/1990 | Equi et al. |
| 4,973,827 A | 11/1990 | Nozaki |
| 5,034,846 A | 7/1991 | Hodge et al. |
| 5,040,994 A * | 8/1991 | Nakamoto et al. ........... 439/76.1 |
| 5,046,971 A | 9/1991 | Ruggiero et al. |
| 5,079,672 A | 1/1992 | Haubner et al. |
| 5,090,911 A | 2/1992 | Welsh |
| 5,106,317 A | 4/1992 | Taylor |
| 5,119,204 A | 6/1992 | Hashimoto et al. |
| 5,137,467 A | 8/1992 | Arai |
| 5,160,879 A | 11/1992 | Tortola et al. |
| 5,171,168 A | 12/1992 | Chiodo |
| 5,175,662 A | 12/1992 | DeBalko et al. |
| 5,178,548 A | 1/1993 | Fortmann et al. |
| 5,184,285 A | 2/1993 | Murphy et al. |
| 5,224,879 A | 7/1993 | Mullins et al. |
| 5,242,319 A | 9/1993 | Ju |
| 5,260,994 A | 11/1993 | Suffi |
| 5,281,172 A | 1/1994 | Luu |
| 5,352,122 A | 10/1994 | Speyer et al. |
| 5,494,449 A | 2/1996 | Chioo |
| 5,540,596 A | 7/1996 | Bothe et al. |
| 5,567,181 A | 10/1996 | Lentz et al. |
| 5,595,503 A | 1/1997 | Pittman et al. |
| 5,616,051 A | 4/1997 | Rogers |
| 5,626,495 A | 5/1997 | Drewnicki |
| 5,641,311 A | 6/1997 | Chuang |
| 5,744,934 A | 4/1998 | Wu |
| 5,755,820 A | 5/1998 | Lan-Jen |
| 5,911,600 A | 6/1999 | Mosquera |
| 5,928,035 A | 7/1999 | Jankowsky et al. |
| 6,089,886 A | 7/2000 | Mareno |
| 6,116,931 A | 9/2000 | McCleerey et al. |
| 6,266,261 B1 | 7/2001 | Lanni |
| 6,297,982 B1 | 10/2001 | Wu |
| 6,305,848 B1 * | 10/2001 | Gregory .......................... 385/53 |
| 6,309,225 B2 | 10/2001 | Kameyama |
| 6,312,271 B1 | 11/2001 | Tseng |
| 6,341,961 B1 | 1/2002 | Juntwait |
| 6,471,365 B2 | 10/2002 | Wang et al. |
| 6,478,440 B1 | 11/2002 | Jaworski et al. |
| 6,488,540 B2 | 12/2002 | Coyle et al. |
| 6,505,402 B2 | 1/2003 | Moriwake et al. |
| 6,527,596 B1 | 3/2003 | Su |
| 6,644,984 B2 | 11/2003 | Vista et al. |
| 6,652,293 B2 | 11/2003 | Fuchs et al. |
| 6,719,571 B2 | 4/2004 | Koerner et al. |
| 6,846,203 B1 | 1/2005 | Su |
| 6,848,918 B2 | 2/2005 | Chuang |
| 6,851,955 B2 | 2/2005 | Chen |
| 6,860,743 B2 | 3/2005 | Ekkul et al. |
| 6,942,508 B2 | 9/2005 | Wong |
| 6,948,949 B1 | 9/2005 | Schwartz et al. |
| 6,981,896 B2 | 1/2006 | Su |
| 6,986,665 B2 | 1/2006 | Schauz et al. |
| 7,002,808 B2 | 2/2006 | Lim et al. |
| 7,029,291 B2 | 4/2006 | Chen |
| 7,101,226 B1 | 9/2006 | Gilliland |
| 7,118,399 B1 | 10/2006 | Wen et al. |
| 7,118,425 B2 | 10/2006 | Chen |
| 7,207,809 B2 | 4/2007 | Sasaki et al. |
| 7,212,420 B2 | 5/2007 | Liao |
| 7,258,576 B2 | 8/2007 | Ohnishi |
| 7,264,405 B2 | 9/2007 | Ikeuchi |
| 7,287,991 B1 | 10/2007 | Li |
| 7,344,385 B2 | 3/2008 | Chen |
| 7,367,846 B1 | 5/2008 | Yang |
| 7,377,802 B2 | 5/2008 | Allen |
| 7,410,388 B2 | 8/2008 | Lin |
| 7,499,301 B2 | 3/2009 | Zhou |
| 7,563,139 B1 | 7/2009 | Wang |
| 7,573,159 B1 | 8/2009 | DeIuliis et al. |
| 7,594,738 B1 | 9/2009 | Lin et al. |
| 7,628,621 B2 | 12/2009 | Tsai |
| 7,658,625 B2 | 2/2010 | Jubelirer et al. |
| 7,713,068 B2 * | 5/2010 | Flynn et al. .................... 439/65 |
| 7,764,157 B2 | 7/2010 | Schulz et al. |
| 7,787,238 B2 | 8/2010 | Liao et al. |
| 7,789,696 B2 | 9/2010 | Umei et al. |
| 7,794,283 B2 | 9/2010 | Wang |
| 7,862,380 B1 | 1/2011 | Wang |
| 7,896,702 B2 | 3/2011 | Stiehl et al. |
| 7,946,884 B2 | 5/2011 | Chiang et al. |
| 7,983,064 B2 | 7/2011 | Zhang et al. |
| 8,011,975 B1 | 9/2011 | Kim et al. |
| 8,021,183 B2 | 9/2011 | Early et al. |
| 8,021,192 B2 | 9/2011 | Takata |
| 8,021,198 B2 | 9/2011 | Lim et al. |
| 8,092,255 B2 | 1/2012 | Wang |
| 8,152,570 B2 | 4/2012 | Kim et al. |
| 8,215,009 B2 | 7/2012 | Early et al. |
| 8,220,956 B2 | 7/2012 | Lai et al. |
| 8,226,424 B1 | 7/2012 | Wang et al. |
| 8,308,493 B2 | 11/2012 | Lim et al. |
| 8,337,250 B1 | 12/2012 | Yang |
| 8,342,861 B2 | 1/2013 | Stiehl et al. |
| 8,411,451 B2 | 4/2013 | Morita et al. |
| 8,469,718 B2 | 6/2013 | Kobayashi et al. |
| 8,480,410 B2 | 7/2013 | Early et al. |
| 8,651,879 B2 | 2/2014 | Stiehl et al. |
| 2002/0118561 A1 | 8/2002 | Katayama et al. |
| 2002/0154528 A1 | 10/2002 | Ravid |
| 2003/0148665 A1 | 8/2003 | Su |
| 2003/0153200 A1 | 8/2003 | Vista et al. |
| 2003/0219997 A1 | 11/2003 | Ekkul et al. |
| 2004/0008532 A1 | 1/2004 | Asawa |
| 2004/0075989 A1 | 4/2004 | Wong et al. |
| 2004/0110397 A1 | 6/2004 | Chen |
| 2004/0204177 A1 | 10/2004 | Pon |
| 2006/0062526 A1 * | 3/2006 | Ikeuchi .......................... 385/88 |
| 2006/0270250 A1 | 11/2006 | Allen |
| 2008/0009145 A1 | 1/2008 | Zhou |
| 2009/0227122 A1 | 9/2009 | Jubeliver et al. |
| 2009/0289596 A1 | 11/2009 | McGinley et al. |
| 2009/0305565 A1 | 12/2009 | Stiehl et al. |
| 2009/0305578 A1 | 12/2009 | Lim et al. |
| 2010/0026087 A1 | 2/2010 | Morita et al. |
| 2010/0061130 A1 | 3/2010 | Zhang et al. |
| 2010/0112848 A1 | 5/2010 | Early et al. |
| 2010/0120278 A1 | 5/2010 | Yang |
| 2010/0159755 A1 | 6/2010 | Lin et al. |
| 2010/0277918 A1 | 11/2010 | Chen et al. |
| 2011/0124227 A1 | 5/2011 | Stiehl |
| 2011/0312224 A1 | 12/2011 | Lim et al. |
| 2012/0005897 A1 | 1/2012 | Early et al. |

(56) References Cited

U.S. PATENT DOCUMENTS

| | | | |
|---|---|---|---|
| 2012/0155041 A1 | 6/2012 | Lin et al. | |
| 2012/0289088 A1 | 11/2012 | Early et al. | |
| 2013/0244500 A1 | 9/2013 | Stiehl et al. | |

FOREIGN PATENT DOCUMENTS

| | | |
|---|---|---|
| CN | 200963813 Y | 10/2007 |
| CN | 101154819 A | 4/2008 |
| CN | 201113769 Y | 9/2008 |
| CN | 201112509 Y | 10/2008 |
| CN | 101359786 A | 2/2009 |
| CN | 101364677 A | 2/2009 |
| CN | 201194274 Y | 2/2009 |
| CN | 101515678 A | 8/2009 |
| CN | 201570645 U | 9/2010 |
| FR | 2763182 | 11/1998 |
| JP | 2002-149285 | 5/2002 |
| JP | 2003-36912 | 2/2003 |
| WO | WO 97/01199 | 1/1997 |
| WO | WO 2008/067726 A1 | 6/2008 |

OTHER PUBLICATIONS

Non-Final Office Action for U.S. Appl. No. 12/408,602, mailed on Oct. 14, 2009, 9 pages.
Restriction Requirement for U.S. Appl. No. 12/363,452, mailed on Feb. 5, 2010, 1 page.
Final Office Action for U.S. Appl. No. 12/135,044, mailed on Mar. 25, 2010, 9 pages.
Non-Final Office Action for U.S. Appl. No. 12/363,452, mailed on Apr. 23, 2010, 7 pages.
Advisory Action for U.S. Appl. No. 12/135,044, mailed on Jun. 2, 2010, 2 pages.
Final Office Action for U.S. Appl. No. 12/408,602, mailed on Jun. 30 2010, 11 pages.
Non-Final Office Action for U.S. Appl. No. 12/135,044, mailed on Jul. 8, 2010, 5 pages.
Final Office Action for U.S. Appl. No. 12/363,452, mailed on Sep. 10, 2010, 15 pages.
Notice of Allowance for U.S. Appl. No. 12/408,602, mailed on Nov. 1, 2010, 8 pages.
Final Office Action for U.S. Appl. No. 12/135,044, mailed on Dec. 1, 2010, 8 pages.
Non-Final Office Action for U.S. Appl. No. 12/363,452, mailed on Feb. 23, 2011, 12 pages.
Non-Final Office Action for U.S. Appl. No. 13/018,208, mailed on Mar. 31, 2011, 9 pages.
Notice of Allowance for U.S. Appl. No. 12/135,044, mailed on Apr. 19, 2011, 7 pages.
Notice of Allowance for U.S. Appl. No. 12/363,452, mailed on May 16, 2011, 8 pages.
Notice of Allowance for U.S. Appl. No. 13/018,208, mailed on Aug. 4, 2011, 8 pages.
Non-Final Office Action for U.S. Appl. No. 13/195,749, mailed on Oct. 24, 2011, 11 pages.
Non-Final Office Action for U.S. Appl. No. 13/018,208, mailed on Dec. 2, 2011, 8 pages.
Non-Final Office Action for U.S. Appl. No. 13/195,749, mailed on Feb. 27, 2012, 7 pages.
Notice of Allowance for U.S. Appl. No. 13/215,660, mailed on Mar. 8, 2012, 13 pages.
Non-Final Office Action for U.S. Appl. No. 12/489,429, mailed on Apr. 13, 2012, 11 pages.
Notice of Allowance for U.S. Appl. No. 13/018,208, mailed on May 7, 2012, 7 pages.
Notice of Allowance for U.S. Appl. No. 13/195,749, mailed on Jul. 12, 2012, 12 pages.
Notice of Allowance for U.S. Appl. No. 13/018,208, mailed on Aug. 17, 2012, 7 pages.
Final Office Action for U.S. Appl. No. 12/489,429, mailed on Nov. 7, 2012, 7 pages.
Non-Final Office Action for U.S. Appl. No. 13/544,872, mailed on Dec. 18, 2012, 11 pages.
International Search Report and Written Opinion for International Application No. PCT/US2010/035916, mailed Aug. 19, 2010, 16 pages.
First Notification for Chinese Patent Application No. 20090155037.6, mailed on Dec. 4, 2009, 2 pages.
Search Report for Chinese Patent ZL2010202249162, dated Dec. 15, 2011, 27 pages.
Office Action for Taiwanese Patent Application No. 099210829, mailed Nov. 12, 2010, 4 pages.
Office Action for Taiwanese Patent Application No. 099210829, mailed Mar. 9, 2011, 4 pages.
Communication under Rule 161 and 162 for EP Patent Application No. 10732526.8, mailed Feb. 13, 2012, 2 pages.
Office Action for Chinese Patent Application No. 200910208129.0, mailed on Sep. 11, 2012, 12 pages.
Office Action for Chinese Patent Application No. 201010200178.2, mailed Mar. 4, 2013, 6 pages.
Notice of Allowance for U.S. Appl. No. 13/544,872, mailed May 10, 2013, 20 pages.
Office Action for Chinese Patent Application No. 201010200178.2, mailed Jan. 6, 2014, 12 pages.
Notice of Allowance for U.S. Appl. No. 13/732,288, mailed on Jan. 9, 2014, 5 pages.
Office Action for Chinese Patent Application No. 201210135461.0, mailed Jan. 30, 2014, 17 pages.
International Preliminary Report on Patentability for International Application No. PCT/US2010/035916, mailed Dec. 12, 2011, 10 pages.
Notice of Allowance for U.S. Appl. No. 13/732,288, mailed on Nov. 13, 2013, 13 pages.
Office Action for Chinese Patent Application No. 201010200178.2, mailed Jul. 12, 2012, 12 pages.
Office Action for Chinese Patent Application No. 201010200178.2, mailed Jun. 7, 2013, 11 pages.
Non-Final Office Action for U.S. Appl. No. 13/732,288, mailed on Jul. 11, 2013, 20 pages.
Office Action for Korean Patent Application No. 10-2012-7000528, mailed Jul. 31, 2013, 10 pages.

* cited by examiner

COMPACT DEVICE HOUSING AND ASSEMBLY TECHNIQUES THEREFOR

CROSS-REFERENCE TO RELATED APPLICATION

This application claims priority to U.S. Provisional Patent Application No. 61/140,599, filed Dec. 23, 2008, entitled "COMPACT DEVICE HOUSING AND ASSEMBLY TECHNIQUES THEREFOR", which is hereby incorporated herein by reference.

BACKGROUND OF THE INVENTION

1. Field of the Invention

The present invention relates to electronic device assemblies and, more particularly, to high density electronic device assemblies.

2. Description of the Related Art

Today, many electronic devices are highly portable so that they can be easily transported by their users. There are many examples of highly portable electronic devices, such as mobile phones, portable media players, personal digital assistants, portable power adapter, etc. There highly portable electronic devices are typically provided in small housings which makes both assembly and repair tedious and difficult.

Given the desire to make electronic devices smaller, there is a need to make electronic device housings even smaller. As the electronic device housings get smaller, the density of electrical components within the electronic device housings increases. With increasing density, the assembly and repair of the electronic devices becomes increasingly difficult.

Thus, there is a continuing need for improved structures and techniques that facilitate assembly of high density housings for electronic devices.

SUMMARY OF THE INVENTION

The invention pertains to compact electronic devices that have high density electronic device assemblies and/or to techniques for forming high density electronic device assemblies.

One aspect of the invention pertains to substrate arrangements for use in electronic device assemblies. The substrate arrangements can include multiple-part substrates that are able to be interconnected and utilized in confined spaces. A multiple-part substrate can pertain to a plurality of printed circuit boards that are electrically connected together when assembled into a printed circuit board arrangement. In one implementation, the printed circuit boards can be arranged around an electrical component (e.g., peripheral bus connector). The use of multiple printed circuit boards that are physically configured around other electrical components facilitates formation of compact electronic devices and/or their assembly.

Another aspect of the invention pertains to a clip for use in electronic device assemblies. The clip provides mechanical and electrical interconnection between two electrical structures, such as a contact pin and an electrical substrate (e.g., printed circuit board), that are coupled together as parts of an electronic device assembly. The clip also enables the mechanical and electrical interconnection to remain removable without substantial effort, which facilitates not only assembly but also repair of the electronic device.

Still another aspect of the invention pertains to a removable cap for an electronic device housing and a method for forming such a removable cap. In one implementation, the electronic device can pertain to a power adapter, and the removable cap can have one or more plugs integrally formed therewith. The one or more plugs can also have metal tips that can be attached. In one implementation, the metal tips are respectively removably attached to the one or more plugs. In one embodiment, the removable cap can be molded in longitudinal direction to have improved cosmetics, e.g., avoid parting lines or seams from forming in undesired portions.

The invention can be implemented in numerous ways, including as a method, system, device or apparatus. Several embodiments of the invention are discussed below.

As a printed circuit assembly, one embodiment of the invention can, for example, include at least: a bottom printed circuit board provided in a first plane; a first side printed circuit board attached to the bottom printed circuit board, the first side printed circuit board being provided in a second plane that is orthogonal to the first plane; a second side printed circuit board attached to the bottom printed circuit board, the first side printed circuit board being provided in the second plane offset from the first side printed circuit board; and a top printed circuit board attached to the first side printed circuit board and the second side printed circuit board, the top printed circuit board being provided in the first plane offset from the bottom printed circuit board.

An electronic device, one embodiment of the invention can, for example, include at least: a housing having at least one opening; an electrical connector accessible from the opening in the housing; and a printed circuit board assembly having a plurality of electrical components coupled thereto, the printed circuit board assembly being provided within the housing and being electrically connected to the electrical connector, and the printed circuit board assembly being configured adjacent to a plurality of sides of the electrical connector.

As a clip for assembly of an electronic device, one embodiment of the invention can, for example, includes at least: a base portion having an opening, the opening including a plurality of interference tabs; at least one upper flexure extending outward from the base portion; and at least one lower flexure extending outward from the base portion. The at least one upper flexure and the at least one lower flexure can be biased towards each other.

As a method for assembly an electronic device having at least one contact pin for electrical connection, one embodiment of the invention can, for example, include at least: providing a housing portion for the electronic device, the housing portion including at least one opening; inserting the at least one contact pin into the at least one opening of the housing portion; attaching a clip to the at least one contact pin to facilitate electrical connection with an electrical component of the electronic device; and attaching the housing portion to a housing of the electronic device.

As a portable power adapter for a portable electronic device, one embodiment of the invention can, for example, include at least: a housing having a removable cap; at least one metal contact pin; a printed circuit board provided within the housing; and a metal clip configured to couple to the at least one metal contact pin and to removably attach to the printed circuit board when the removable cap is attached to the housing.

Other aspects of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like elements, and in which.

DETAILED DESCRIPTION OF THE INVENTION

The invention pertains to compact electronic devices that have high density electronic device assemblies and/or to techniques for forming high density electronic device assemblies.

Embodiments of the invention are discussed below with reference to FIGS. 1-8B. However, those skilled in the art will readily appreciate that the detailed description given herein with respect to these figures is for explanatory purposes as the invention extends beyond these limited embodiments.

One aspect of the invention pertains to substrate arrangements for use in electronic device assemblies. The substrate arrangements can include multiple-part substrates that are able to be interconnected and utilized in confined spaces. A multiple-part substrate can pertain to a plurality of printed circuit boards that are electrically connected together when assembled into a printed circuit board arrangement. In one implementation, the printed circuit boards can be arranged around an electrical component (e.g., peripheral bus connector). The use of multiple printed circuit boards that are physically configured around other electrical components facilitates formation of compact electronic devices and/or their assembly.

Figure 1:
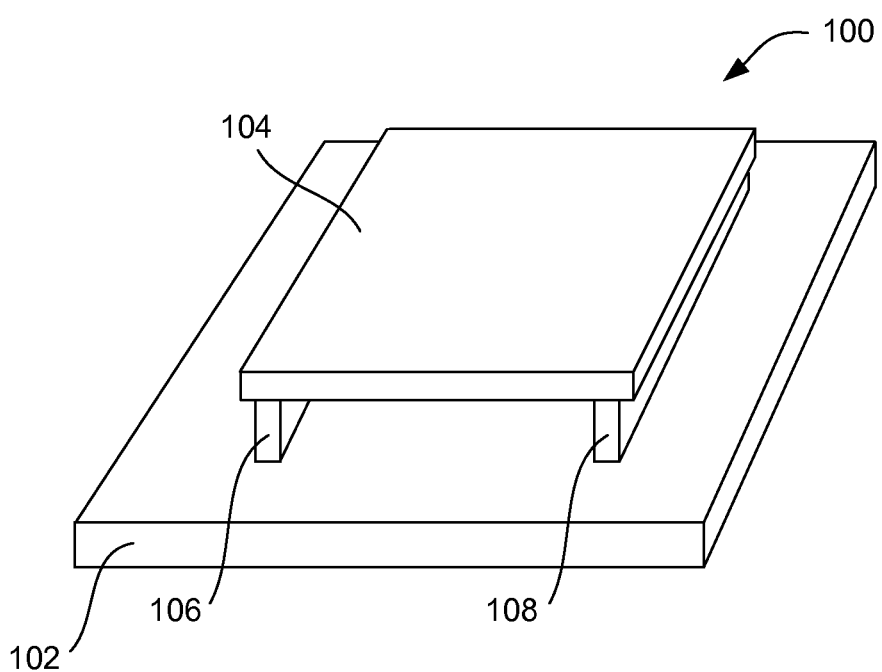
FIG. 1 is a perspective view of a printed circuit assembly according to one embodiment of the invention.

FIG. 1 is a perspective view of a printed circuit assembly 100 according to one embodiment of the invention. The printed circuit assembly 100 includes a bottom printed circuit board 102, a top printed circuit board 104, a first side printed circuit board 106, and a second side printed circuit board 108. As shown in FIG. 1, the printed circuit assembly 100 can arrange the printed circuit boards 102-108 in a rectangular or box-like configuration. For example, the first side printed circuit board 106 and the second side printed circuit board 108 can attach between the bottom printed circuit board 102 and the top printed circuit board 104. In this example, the top printed circuit board 104 is substantially parallel to but offset from the bottom printed circuit board 104 by the first side printed circuit board 106 and the second side printed circuit board 108. Also, in this example, the first side printed circuit board 106 and the second side printed circuit board 108 are positioned substantially orthogonal to the bottom printed circuit board 102. The second side printed circuit board 108 is also substantially parallel to but offset from the first side printed circuit board 106.

Although the printed circuit assembly 100 illustrated in FIG. 1 uses an arrangement of four (4) separate printed circuit boards, it should be understood that in other embodiments, the number, size, shape (configuration) and/or arrangement of the printed circuit boards can vary, such as depending on its application. Generally, a plurality of separate printed boards are designed to reside in different planes (orientations) and to attach together during assembly such that adequate printed circuit board area is able to be efficiently provided in a confined space. Also, although the printed circuit assembly 100 arranges the printed circuit boards 102-108 in a rectangular manner, the arrangement can have other shapes or configurations, triangular, hexagonal, circular, curved or complex shapes.

Figure 2:
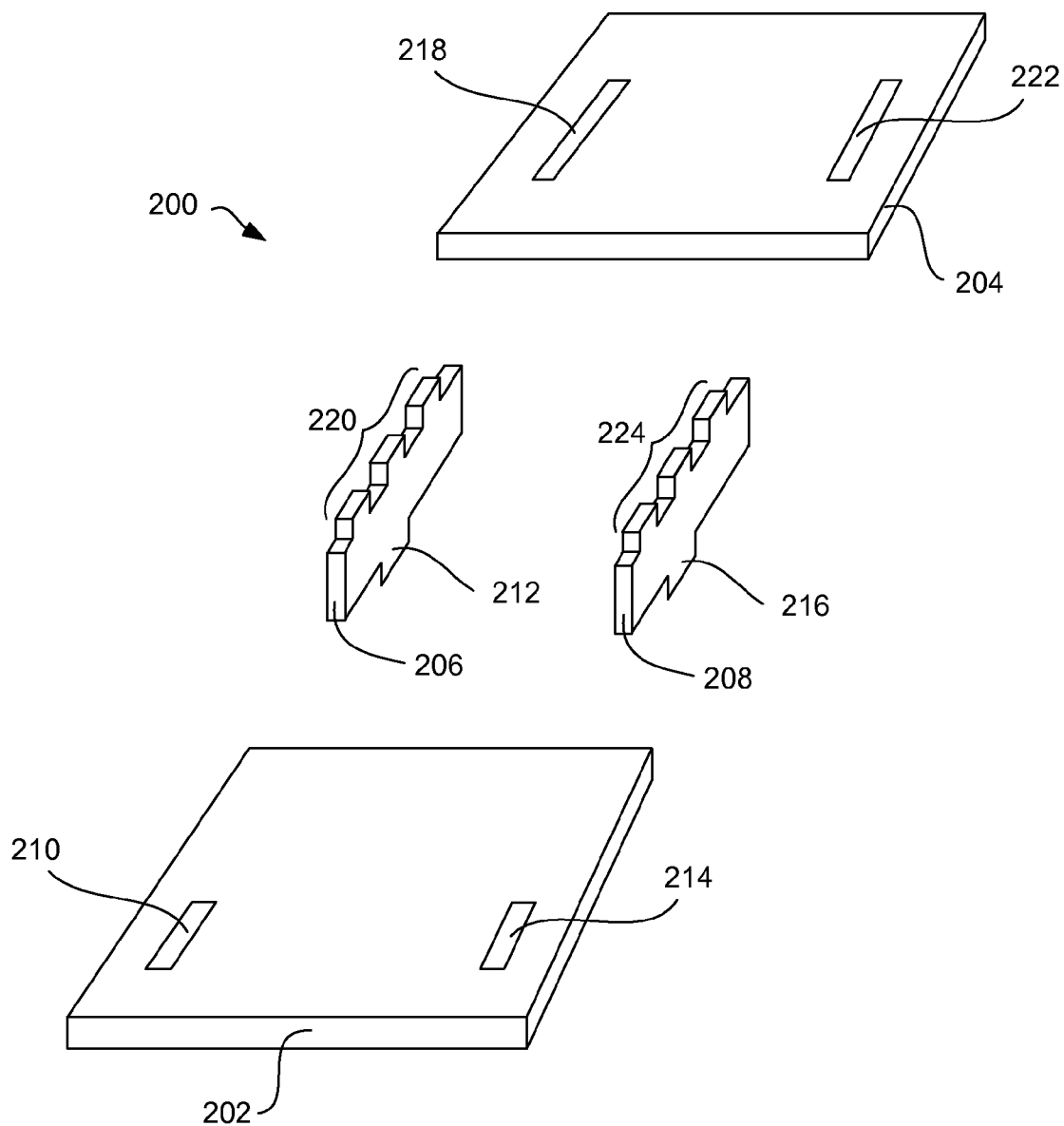
FIG. 2 is a perspective assembly view for a printed circuit assembly according to one embodiment of the invention.

FIG. 2 is a perspective assembly view for a printed circuit assembly according to one embodiment of the invention. The printed circuit assembly is assembled from a bottom printed circuit board 202, a top printed circuit board 204, a first side printed circuit board 206, and a second side printed circuit board 208.

The bottom printed circuit board 202 includes a first slot 210 for receiving a protrusion 212 of the first side printed circuit board 206. By inserting the protrusion 212 into the first slot 210, the first side printed circuit board 206 can be attached and supported by the bottom printed circuit board 202. Further, the protrusion 212 can be secured within the opening 210 of the first side printed circuit board 206. The bottom printed circuit board 202 also includes a second slot 214 for receiving a protrusion 216 of the second side printed circuit board 208. By inserting the protrusion 216 into the second slot 214, the second side printed circuit board 208 can be attached and supported by the bottom printed circuit board 202. Further, the protrusion 216 can be secured within the opening 214 of the second side printed circuit board 208.

The top printed circuit board 204 includes a first slot 218 for receiving a protrusion section 220 of the first side printed circuit board 206. The first slot 218 of the top printed circuit board 204 can then be placed around the protrusion section 220 of the first side printed circuit board 206. As a result, the top printed circuit board 204 can be supported by the first side printed circuit board 206. In addition, the protrusion section 220 can be secured to the top side printed circuit board 204. The top printed circuit board 204 also includes a second slot 222 for receiving a protrusion section 224 of the second side printed circuit board 208. The second slot 222 of the top printed circuit board 204 can then be placed around the protrusion section 224 of the second side printed circuit board 208. As a result, the top printed circuit board 204 can be supported by the second side printed circuit board 208. In addition, the protrusion section 224 can be secured to the top side printed circuit board 204.

Figure 3A:
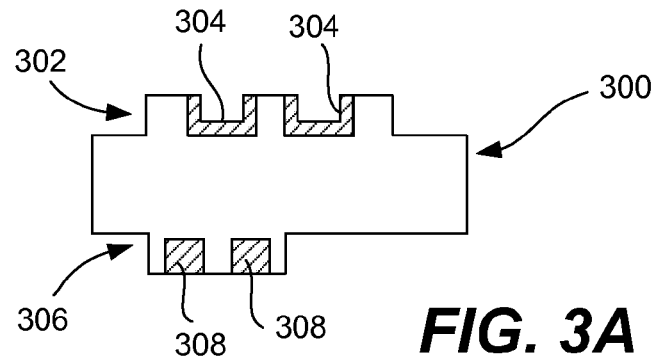
FIGS. 3A-3C are illustrations of printed circuit boards that are suitable for attachment together to form a printed circuit assembly according to one embodiment of the invention.
Figure 3B:
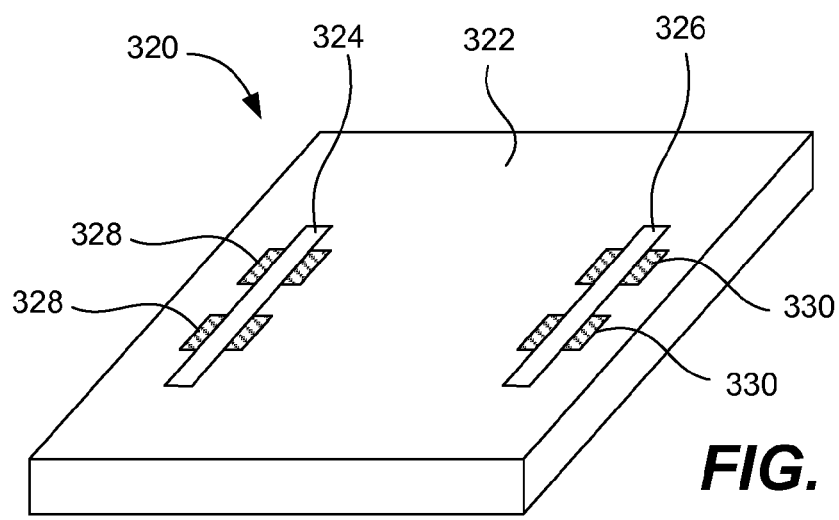
Figure 3C:
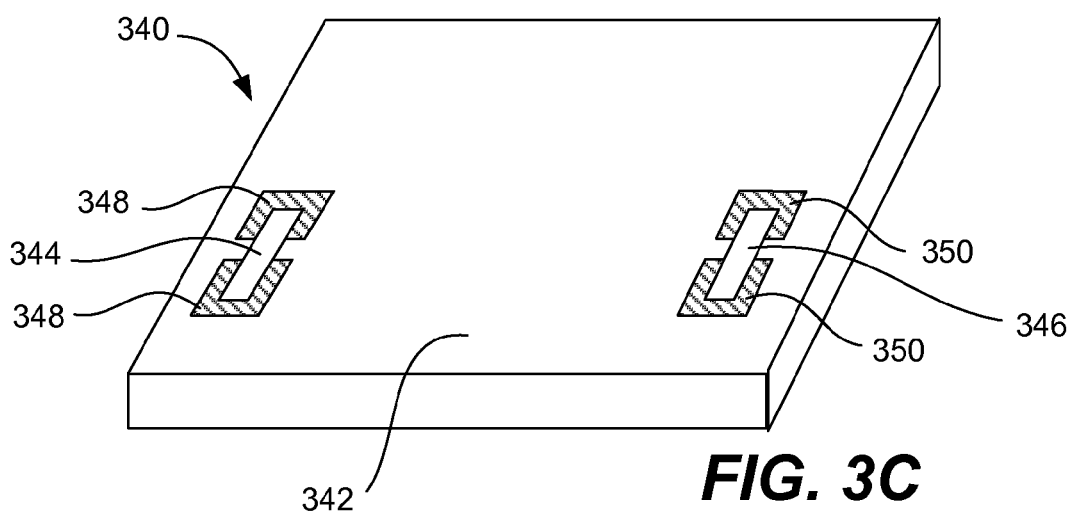

FIGS. 3A-3C are illustrations of printed circuit boards that are suitable for attachment together to form a printed circuit board arrangement according to one embodiment of the invention.

FIG. 3A is a side view of a side printed circuit board 300 according to one embodiment of the invention. The side printed circuit board 300 includes a first protrusion 302 that facilitates connection of the side printed circuit board 300 with another printed circuit board, namely, a top or bottom printed circuit board. The side printed circuit board 300 also includes a second protrusion 306 that facilitates connection of the side printed circuit board 300 with another printed circuit board, namely, a top or bottom printed circuit board. Additionally, to facilitate electrical as well as mechanical interconnection between the side printed circuit board 300 and another printed circuit board, the first protrusion 302 can include one or more solder notches 304. The solder notches 304 are notched inward so as to provide solder channels. In one implementation, although not shown in FIG. 3A, the solder notches 304 can be rounded. Also, the second protrusion 306 can include one or more solder pads 308 that facilitate electrical as well as mechanical interconnection between the side printed circuit board and another printed circuit board.

FIG. 3B is a perspective view of a top printed circuit board 320 according to one embodiment of the invention. The top printed circuit board 320 includes a top surface 322. The top printed circuit board 320 includes a first opening 324 for receiving a first side printed circuit board, and a second opening 326 for receiving a second side printed circuit board. The first side printed circuit board and the second side printed circuit board can be configured as the side printed circuit board 300 illustrated in FIG. 3A. Proximate to the first opening 324, one more solder pads 328 can be provided on the top surface 322 of the top printed circuit board 320. The one or more solder pads 328 facilitate electrical as well as mechanical interconnection between the first side printed circuit board inserted into the first opening 324. For example, if the side printed circuit board 300 were inserted in the first opening 324, the top protrusion 302 would fit within the first opening 324, and the position of the solder notches 304 would correspond to (e.g., align with) the position of the solder pads 328. Hence, by applying solder at the solder pads 328 across the width of the first opening 324 through the corresponding solder notches 304, the solder pads 328 can be mechanically and electrically interconnected to the corresponding solder notches 304.

Similarly, proximate to the second opening 326, one more solder pads 330 can be provided on the top surface 322 of the top printed circuit board 320. The one or more solder pads 330 facilitate electrical as well as mechanical interconnection between the second side printed circuit board inserted into the second opening 326. For example, if the side printed circuit board 300 were inserted in the second opening 326, the top protrusion 302 would fit within the second opening 326, and the position of the solder notches 304 would correspond to (e.g., align with) the position of the solder pads 330. Hence, by applying solder at the solder pads 330 across the width of the second opening 326 and through the corresponding solder notches 304, the solder pads 330 can be mechanically and electrically interconnected to the corresponding solder notches 304.

FIG. 3C is a perspective view of a bottom printed circuit board 340 according to one embodiment of the invention. The bottom printed circuit board 340 includes a bottom (i.e., underside) surface 342. As illustrated in FIG. 3C, the bottom surface 342 is shown while the top surface of the bottom printed circuit board 340 is hidden. The bottom printed circuit board 340 includes a first opening 344 for receiving the first side printed circuit board, and a second opening 346 for receiving the second side printed circuit board.

One more solder pads 348 can be provided on the bottom surface 342 of the bottom printed circuit board 340, proximate to the first opening 344. The one or more solder pads 348 facilitate electrical as well as mechanical interconnection between the first side printed circuit board inserted into the first opening 344. For example, if the side printed circuit board 300 were inserted in the first opening 344 from a top surface of the bottom printed circuit board 340, the bottom protrusion 306 would fit within the first opening 344, and the position of the solder pads 308 would respectively correspond to (e.g., align with) the position of the solder pads 348. Hence, by applying solder at the solder pads 348 across or adjacent the first opening 344, the solder pads 348 can be mechanically and electrically interconnected to the corresponding solder pads 308.

One more solder pads 350 can be provided on the bottom surface 342 of the bottom printed circuit board 340, proximate to the second opening 346. The one or more solder pads 350 facilitate electrical as well as mechanical interconnection between the second side printed circuit board inserted into the second opening 346. For example, if the side printed circuit board 300 were inserted in the second opening 346 from a top surface of the bottom printed circuit board 340, the bottom protrusion 306 would fit within the second opening 346, and the position of the solder pads 308 would respectively correspond to (e.g., align with) the position of the solder pads 350. Hence, by applying solder at the solder pads 350 across or adjacent the second opening 346, the solder pads 350 can be mechanically and electrically interconnected to the corresponding solder pads 350.

The various printed circuit boards can include electrical components mounted on the printed circuit boards. Examples of electrical components are capacitors, resistors, inductors, transistors, and integrated circuit chips. One or both of these sides of any of the printed circuit boards can include electrical components mounted thereto. Besides electrical components, the various printed circuit boards typically also include metal (e.g., cooper, aluminum, solder) traces or solder connections.

Figure 4A:
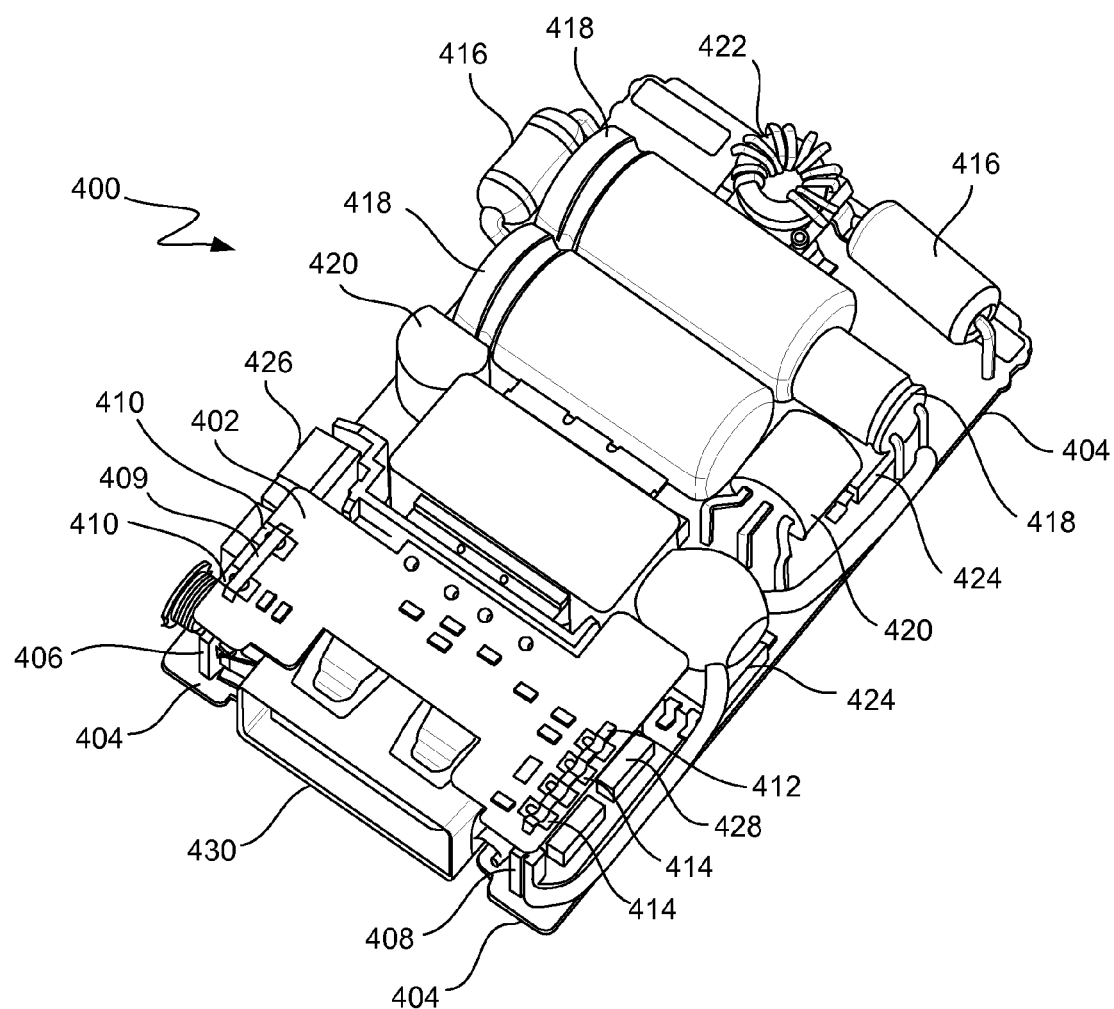
FIGS. 4A and 4B are perspective views of an assembled electronic device according to one embodiment of the invention.
Figure 4B:
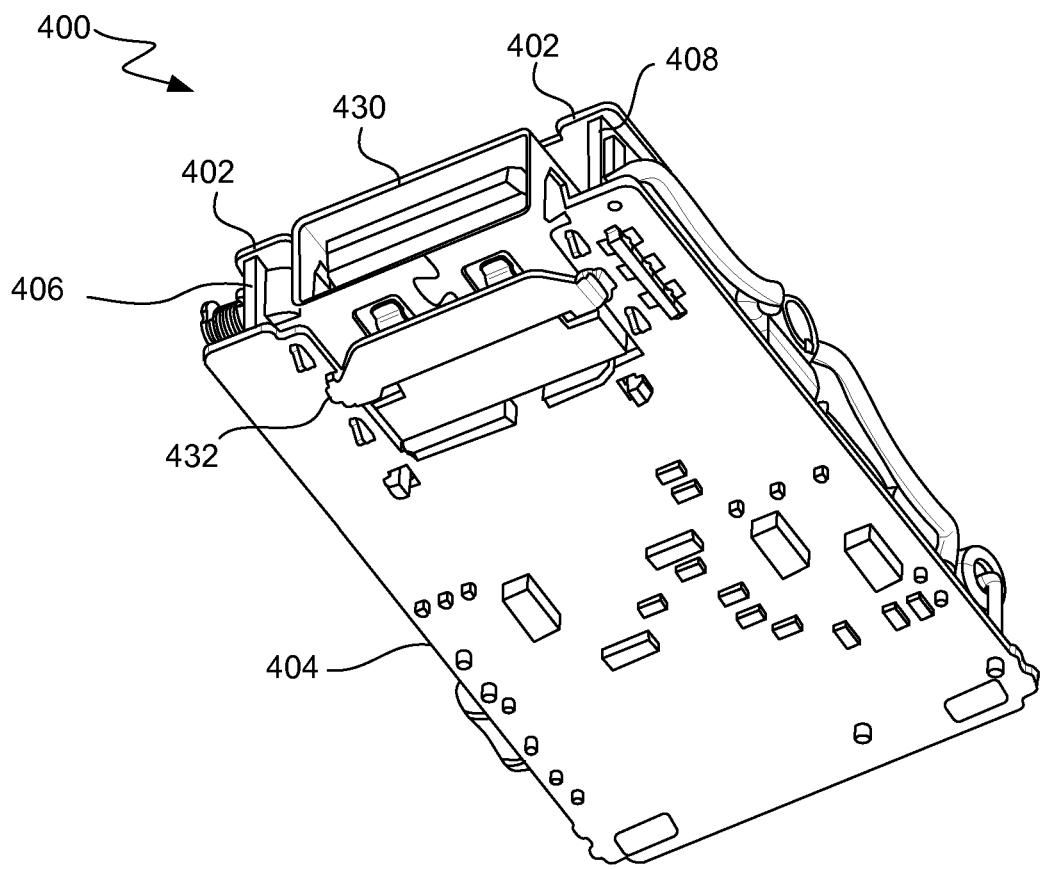

FIGS. 4A and 4B are perspective views of an assembled electronic device 400 according to one embodiment of the invention. FIG. 4A is a top perspective view of an assembled electronic device 400 according to one embodiment of the invention, and FIG. 4B is a bottom perspective view of the assembled electronic device 400 as illustrated in FIG. 4A.

The assembled electronic device 400 includes a multi-part printed circuit board arrangement that includes a top printed circuit board 402, a bottom printed circuit board 404, a left printed circuit board 406, and a right printed circuit board 408. Each of the printed circuit boards 402-408 can have electrical components attached. In this embodiment, the bottom printed circuit board 404 is a primary printed circuit board. The left printed circuit board 406 and the right printed circuit board 408 are attached to the bottom printed circuit board 404. The top printed circuit board 402 is also attached to the left printed circuit board 406 and the right printed circuit board 408.

The attachment of the printed circuit board provides mechanical support as well as electrical connection between the printed circuit boards. A protrusion 409 of the left side printed circuit board 406 can extend through an opening in the top printed circuit board 402 and have solder pads (e.g., solder pads 306) on the protrusion 408 (e.g., protrusion 306) soldered to solder pads 410 provided on the top surface of the top printed circuit board 402. A protrusion 412 of the right side printed circuit board 408 can extend through an opening in the top printed circuit board 402 and have solder notches (e.g., solder notches 304) on the protrusion 412 (e.g., protrusion 302) soldered to solder pads 414 provided on the top surface of the top printed circuit board 402.

Each of the printed circuit boards 402-408 can have electrical components attached. One or both of these sides of any of the printed circuit boards can include electrical components mounted thereto. Examples of electrical components are capacitors, resistors, inductors, transistors, and integrated circuit chips. For example, the bottom printed circuit board 404 includes at least resisters 416, capacitors 418, transistors 420, inductors 422, and integrated circuit packages 424. The left side printed circuit board 406 can include similar components, such as integrated circuit packages 426. The right side printed circuit board 408 can also include similar components, such as integrated circuit packages 428. Besides electrical components, the various printed circuit boards typically also include metal (e.g., cooper, aluminum, solder) traces, solder connections, metal wires and/or metal leads.

The bottom printed circuit board 404 illustrated in FIG. 4B is substantially larger than the top printed circuit board 402 illustrated in FIG. 4A. Also, the left and right printed circuit boards 406 and 408 are also relatively small such that in the assembled electronic device 400 is compact. By providing the multi-part printed circuit board arrangement, the area required for the assembled electronic device 400 is reduced. As a result, the assembled electronic device 400 is a high density assemble that can be particularly compact.

The assembled electronic device 400 also has an electrical connector 430. In the embodiment illustrated in FIGS. 4A and 4B, the top printed circuit board 402 and the left and right printed circuit boards 406 and 408 are substantially adjacent the electrical connector 430, e.g., a peripheral bus connector, that forms part of the assembled electronic device 400. For example, the electrical connector 430 can be a Universal Serial Bus (USB) connector. The electrical connector 430 can be attached to the bottom printed circuit board 404. A bracket 432 can be used to attached or support the electrical connector 430 with respect to the bottom printed circuit board 404. Additionally, in the embodiment illustrated in FIGS. 4A and 4B, the multi-part printed circuit board arrangement is formed around the electrical connector 430. As a result, the printed circuit board arrangement can be compactly provided around an electrical connector.

The bottom printed circuit board 404 illustrated in FIG. 4B is substantially larger than the top printed circuit board 402 illustrated in FIG. 4A. Also, the left and right printed circuit boards 406 and 408 are also relatively small such that in the assembled electronic device 400 is compact. By providing the multi-part printed circuit board arrangement, the area required for the assembled electronic device 400 is reduced. For example, as illustrated in FIGS. 4A and 4B, the top printed circuit board 402 and the left and right printed circuit boards 406 and 408 are substantially adjacent the electrical connector 430.

Figure 5A:
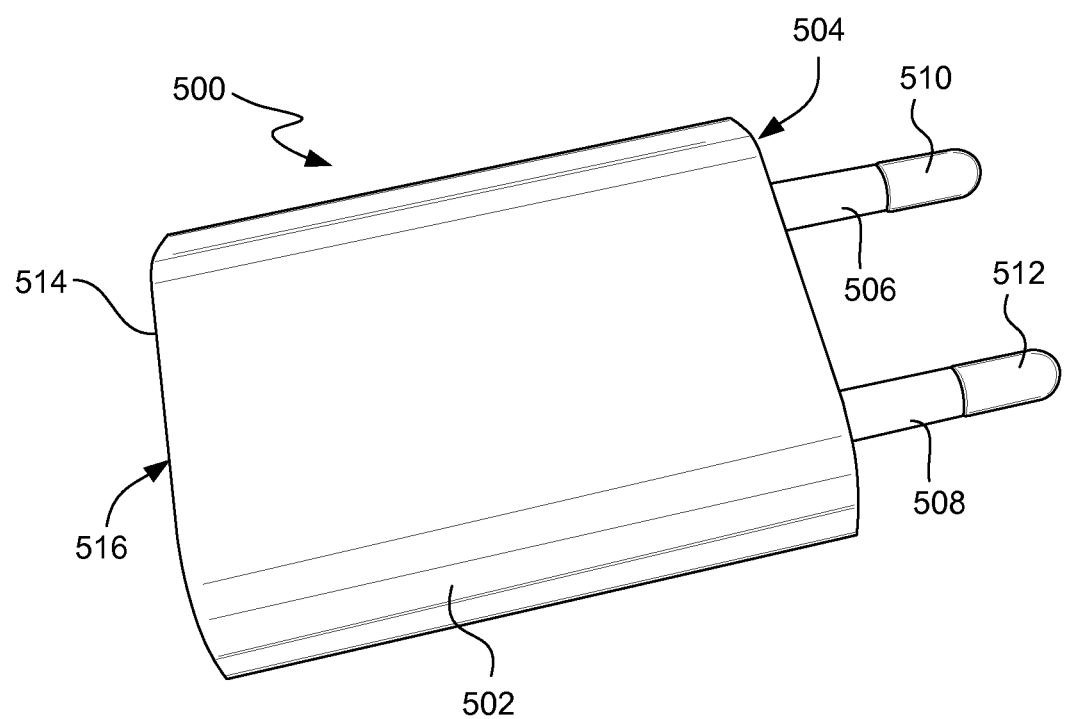
FIGS. 5A-5C are perspective views of an electronic device according to one embodiment of the invention.
Figure 5B:
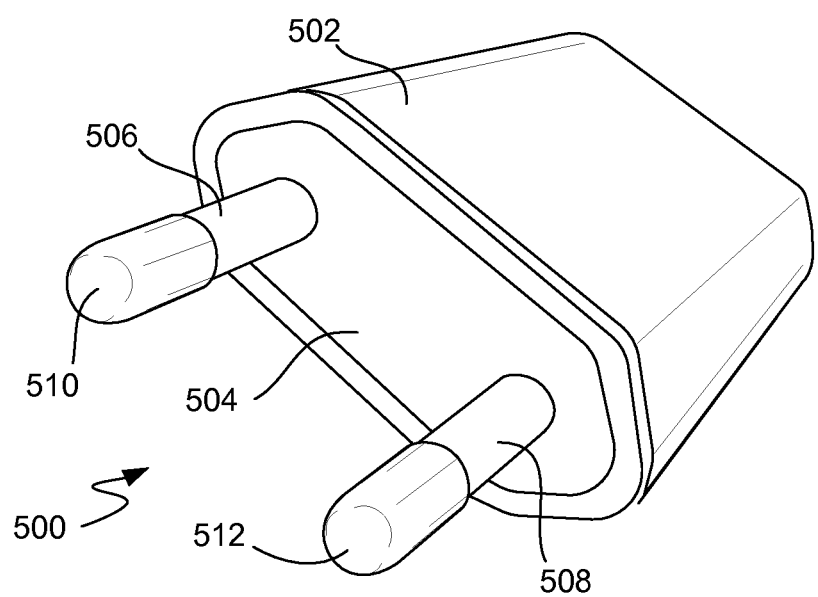
Figure 5C:
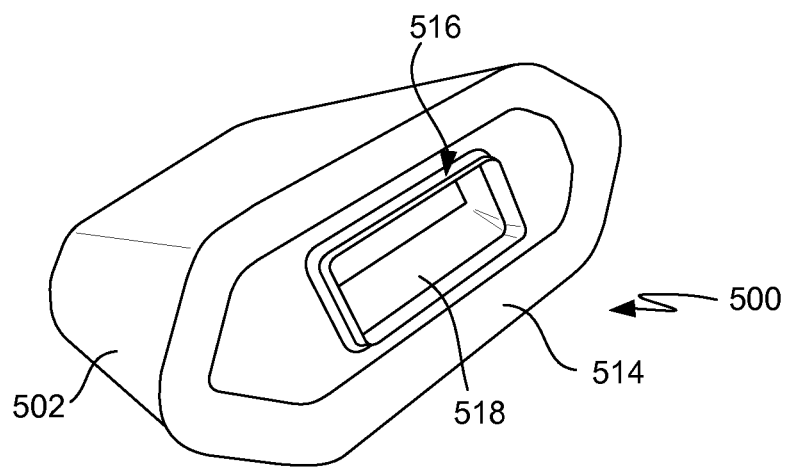

FIGS. 5A-5C are perspective views of an electronic device 500 according to one embodiment of the invention. The electronic device 500 in this embodiment is a portable power adapter. The portable power adapter can be plugged into an electrical outlet. The portable power adapter can receive AC power from the electrical outlet and convert it into DC power. The DC power can then be made available to another electronic device that can couple to the portable power adapter.

FIG. 5A illustrates a side perspective view of the electronic device 500. The electronic device 500 includes a device housing 502. As an example, the assembled electronic device 400 illustrated in FIGS. 4A and 4B can be provided internal to the device housing 502. A first end of the device housing 502 is configured to receive a removable cap 504 (removable end cap). With the removable cap 504 removed, the assembled electronic device 400 can be inserted into the device housing 502. In FIG. 5A the removable cap 504 is illustrated as being attached to the device housing 502. The removable cap 504 includes or supports a first plug 506 and a second plug 508. As illustrated, the plugs 506 and 508 are of a European configuration, however various other configurations are equally possible, including the U.S. configuration. The plugs 506 and 508 can be inserted into a power outlet (e.g., AC outlet). The plugs 506 and 508 can respectively include metal tips 510 and 512 which facilitate electrical connection when inserted into the power outlet. A second end 514 includes an electrical connector 516 that facilitates electrical connection with another device. When the electronic device 500 is a portable power adapter, the electrical connector 516 serves to provide power from the portable power adapter to another device that is electrically connected to the electrical connector 516. As one example, the electrical connector 516 can pertain to a USB connector.

FIG. 5B illustrates a first end perspective view of the electronic device 500. The removable cap 504 is illustrated attached to the device housing 502. The plugs 506 and 508 of the removable cap 504 are illustrated projecting outward from the removable cap 504. The plug 506 and 508 can have an exterior non-conductive shell (e.g., plastic) with an inner metal conductor that electrically connects the metal tips 510 and 512 to the assembled electronic device within the device housing 502.

FIG. 5C illustrates a second end perspective view of the electronic device 500. The electrical connector 516 is accessible from an opening 518 in the second end 514.

Another aspect of the invention pertains to a clip for use in electronic device assemblies. The clip provides mechanical and electrical interconnection between two electrical structures, such as a contact pin and an electrical substrate (e.g., printed circuit board), that are coupled together as parts of an electronic device assembly. The clip also enables the mechanical and electrical interconnection to remain removable without substantial effort, which facilitates not only assembly but also repair of the electronic device.

Figure 6A:
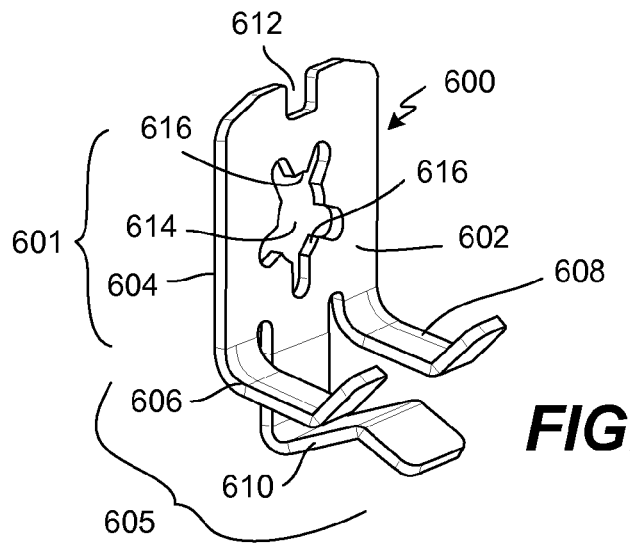
FIGS. 6A-6D are views of a clip according to one embodiment of the invention.
Figure 6B:
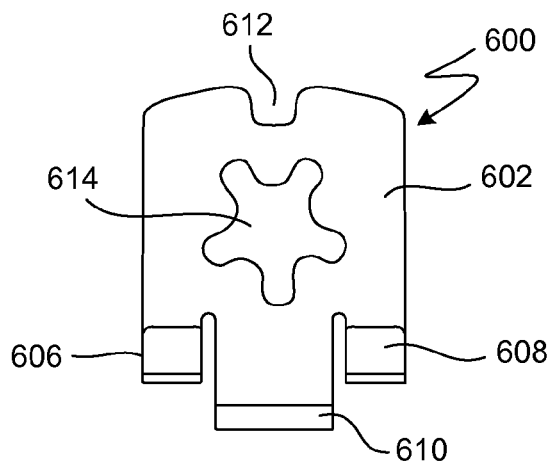
Figure 6C:
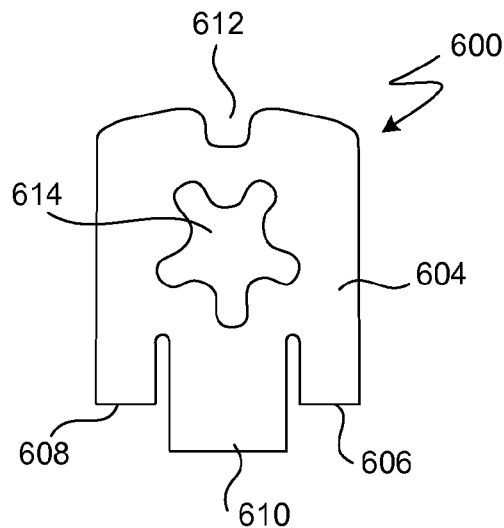
Figure 6D:
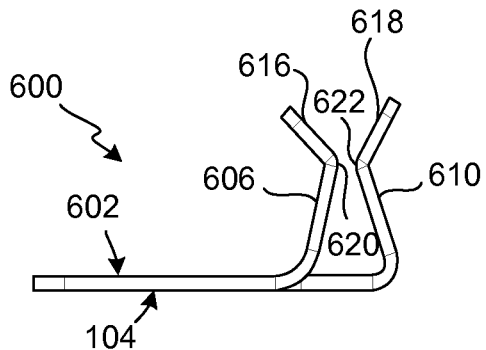

FIGS. 6A-6D are views of a clip 600 according to one embodiment of the invention. FIG. 6A is a perspective view of the clip 600. FIG. 6B is a front view of the clip 600. FIG. 6C is a rear view of the clip 600. FIG. 6D is a side view of the clip 600. The clip 600 can, for example, be used in the assembly of an electronic device, such as a power adapter.

The clip 600 is a metal clip. The clip 600 can be formed from a metal such as brass, copper or aluminum. The clip 600 includes a base portion 601 having a front surface 602 and a rear surface 604. The clip 600 also includes a clip portion 605 having a first upper flexure 606, a second upper flexure 608 and a lower flexure 610.

The clip 600 can be use to facilitate mechanical and electrical connection between different electrical components of the electronic device. For example, the clip 600 can facilitate electrical connection between a printed circuit board and a contact pin. The upper flexures 606, 608 are biased towards the lower flexure 610 so that an edge (e.g., side) of the printed circuit board can be received between the upper flexures 606, 608 and the lower flexure 610. The biasing facilitates securing the printed circuit board to the clip 600. Also, since the clip 600 is metal and electrically conductive, the flexures 606, 608 and 610 610 can also make electrical contact with the printed circuit board while received between the upper flexures 606, 608 and the lower flexure 610 of the clip 600. Hence, the flexures 606, 608 and 610 of the clip 600 can provide both mechanical and electrical connection with a substrate, such as a printed circuit board.

An alignment notch 612 can be provided in the clip 600 to facilitate alignment of the clip 600 with respect to a housing portion for the electronic device. Further, the clip 600 includes an opening 614 in the base portion. As discussed below, the opening 614 is able to receive a contact pin of a power adapter. When the contact pin is provided within the opening 614, the clip 600 is mechanically and electrically coupled to the contact pin. The inner surface of the opening 612 can include a plurality of tabs 616. The tabs 616 (e.g., interference tabs) can serve to secure the contact pin within the opening 612, e.g., by mechanical interference.

In one example, the housing portion for electronic device is a portion of a housing for the electronic device. In one embodiment, the housing portion is a removable cap. For example, the electronic device can pertain to a power adapter which has a base housing and a removable cap. The removable cap can have at least one contact pin that extends therethrough. While the contact pin extends outward from an outer surface the removable cap, the clip 600 can be used to secure the contact pin against an inner surface of the removable cap. The clip 600 also facilitates electrical connection between the contact pin and a printed circuit board to be provided within the base housing for the power adapter. Still further, the clip 600 provides a mechanical connection to the printed circuit board. Since the clip 600 uses flexures 606, 608 and 610 to provide the electrical and mechanical coupling with a printed circuit board, the clip 600 (and thus the removable cap) remain removable from the printed circuit board (as well as the base housing).

As shown in FIG. 6D, each of the first upper flexure 606 and the second upper flexure 608 can have a flared end 616, and the lower flexure 610 can have a flared end 618. The flared ends 616 and 618 facilitate receiving of a printed circuit board between the upper flexures 606, 608 and the lower flexure 610. Additionally, the first upper flexure 606 and the second upper flexure 608 can each have a contact region 620 that can serve to make contact with an upper surface of a printed circuit board when the printed circuit board has been inserted between the upper flexures 606, 608 and the lower flexure 610. The lower flexure 610 can also have a contact region 622 that can serve to make contact with a lower surface of the printed circuit board when the printed circuit board has been inserted between the upper flexures 606, 608 and the lower flexure 610.

Although the clip 600 includes two upper flexures and one lower flexure, it should be noted that in other embodiments, the number of upper and lower flexures can vary. Hence, in general, a clip according to embodiments of the invention can include at least one upper flexure and at least one lower flexure.

Figure 6E:
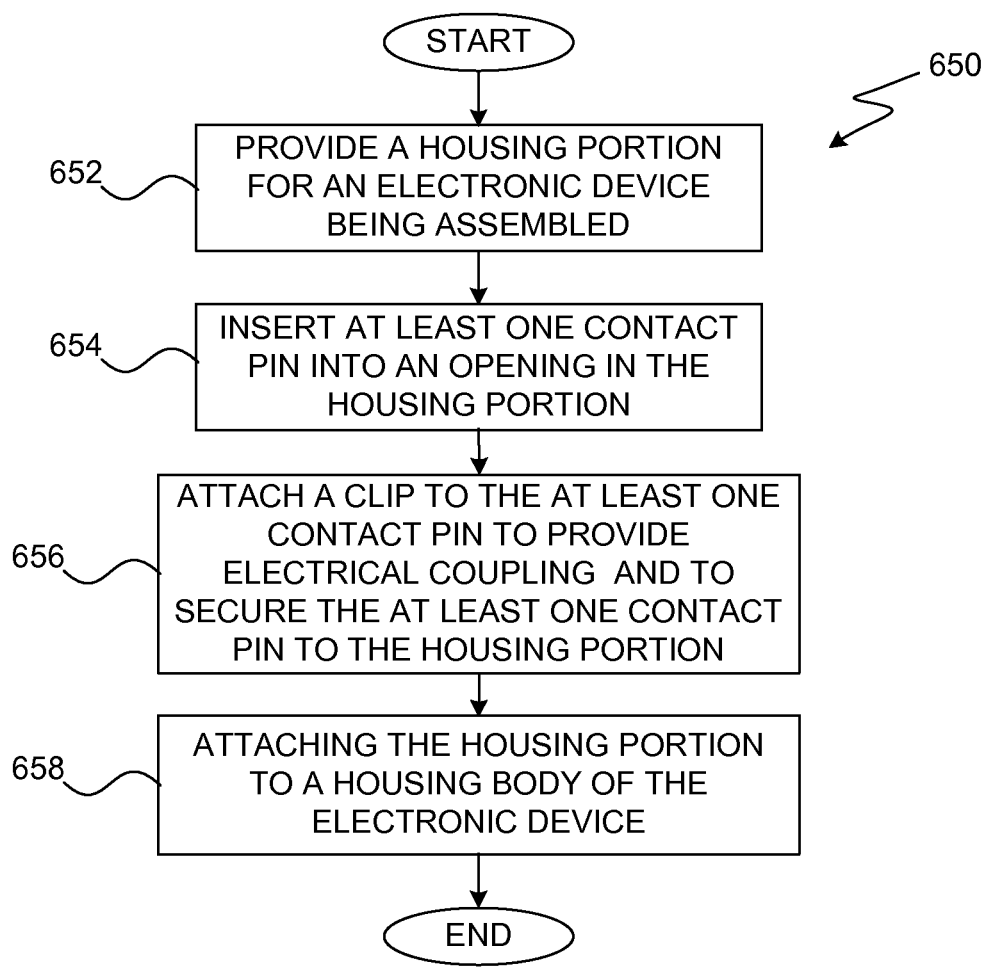
FIG. 6E is a flow diagram of an assembly process for an electronic device according to one embodiment of the invention.

FIG. 6E is a flow diagram of an assembly process 650 for an electronic device according to one embodiment of the invention. The assembly process 650 can represent assembly of a portion of an electronic device that includes a contact pin external to a housing. As an example, the housing can pertain to a power adapter.

The assembly process 650 can provide 652 a housing portion for an electronic device being assembled. At least one contact pin can be inserted 654 into an opening in the housing portion. A clip can then be attached 656 to the at least one contact pin. The clip provides electrical coupling and can secure the at least one contact pin to the housing portion. Next, the housing portion can be attached 658 to a housing body of the electronic device.

As an example, the housing portion can be a removable end piece (e.g., removable cap) of a device housing (i.e., housing body) of the electronic device. The removable end piece can have an opening that receives a contact pin. The contact pin can be inserted into the opening and then secured in place with a clip, such as the metal clip illustrated in FIGS. 6A-6D. Thereafter, the removable end piece with the opening having the contact pin and the clip can be attached to the device housing of the electronic device. When the removable end piece is attached to the device housing, the clip can mechanically and electrically couple (e.g., removably attach) with a printed circuit board provided within the device housing. The clip can include flexures that are mechanically biased so that the printed circuit board can be removably coupled (both mechanically and electrically) to the clip by way of the flexures.

Still another aspect of the invention pertains to a removable cap for an electronic device housing and a method for forming such a removable cap. In one implementation, the electronic device can pertain to a power adapter, and the removable cap can have one or more plugs integrally formed therewith. The one or more plugs can also have metal tips that can be attached. In one implementation, the metal tips are respectively removably attached to the one or more plugs. In one embodiment, the removable cap can be molded in longitudinal direction to have improved cosmetics, e.g., avoid parting lines or seams from forming in undesired portions. For example, the removable cap (including the plugs) can be molded in a longitudinal direction with the metal tips removed, and subsequent to molding the metal tips can be attached to the ends of the plugs. In FIGS. 7A, 7B, 8A and 8B, a removable cap according to one embodiment is further described below.

Figure 7A:
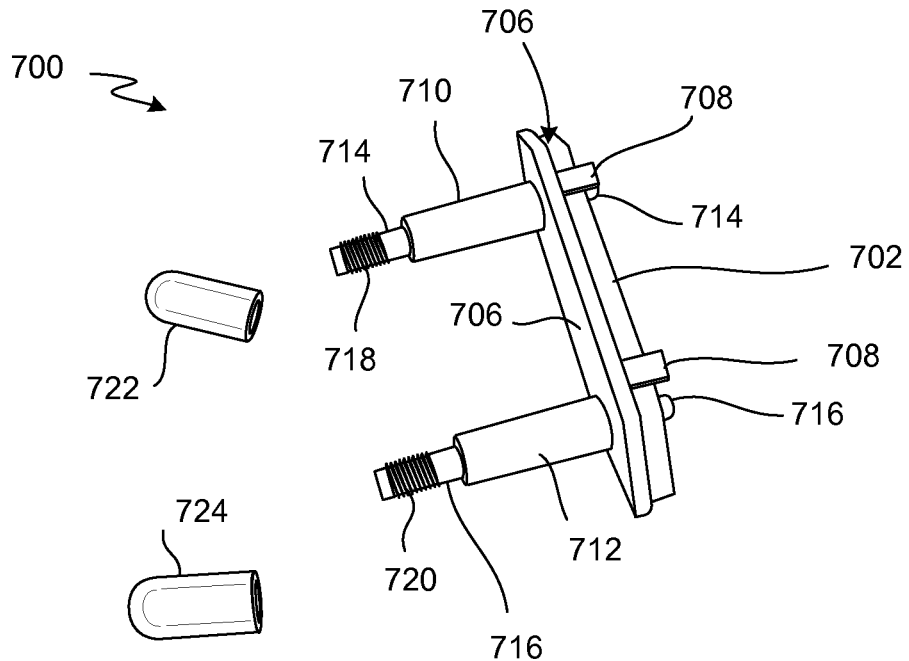
FIGS. 7A and 7B are perspective views of a removable cap according to one embodiment of the invention.
Figure 7B:
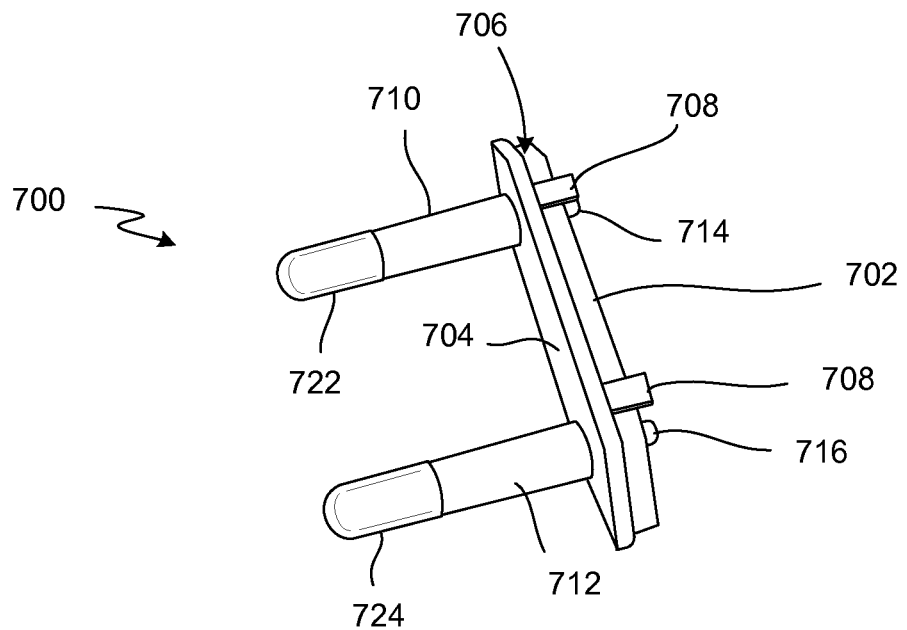

FIGS. 7A and 7B are perspective views of a removable cap 700 according to one embodiment of the invention. The removable cap 700 is, for example, suitable for use as the removable cap 504 illustrated in FIGS. 5A and 5B. The removable cap 700 includes an inner side 702 and an outer side 704. The inner side 702 includes a recess 706 about the periphery of the removable cap 700. The inner surface 702 also includes features 708 that facilitate attachment of the removable cap 700 to a device housing (e.g., device housing 502). The outer side 704 includes plugs 710 and 712. The plugs 710 and 712 can be integrally formed with the outer side 704 (as well as the inner side 702). Internal to the plugs 710 and 712 are metal pins 714 and 716, respectively. The metal pin 714 extends internally through the plug 710 and through an opening in the outer side 704 and the inner side 702, and the metal pin 716 extends internally through the plug 712 and through an opening in the outer side 704 and the inner side 702. Thus, the metal pins 714 and 716 are exposed at the inner side 702 of the removable cap 700. The metal pins 714 and 716 are also exposed at the outer side 704 (at the ends of the plugs 710 and 712) and can contain threads 718 and 720, respectively. A metal tip 722 can be attached to the exposed portion of the metal pin 714 using the threads 718, and a metal tip 724 can be attached to the exposed portion of the metal pin 716 using the threads 720. In FIG. 7A, the metal tips 722 and 724 are respectively removed from the metal pins 714 and 716. In FIG. 7B the metal tips 722 and 724 are respectively attached to the metal pins 714 and 716. In other embodiment, the metal tips 722 and 724 can be attached to the metal pins 714 and 716 using other than through using of mating threads. For example, the metal tips 722 and 724 can be glued, snapped, press-fix, formed, etc. to the metal pins 714 and 716.

Figure 8A:
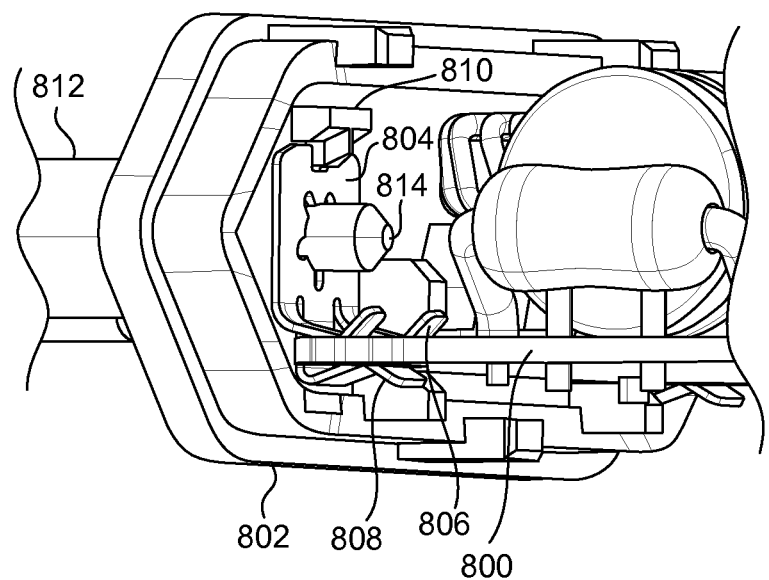
FIGS. 8A and 8B are partial perspective views illustrating attachment of a printed circuit board to a removable cap of a device housing according to one embodiment of the invention.
Figure 8B:
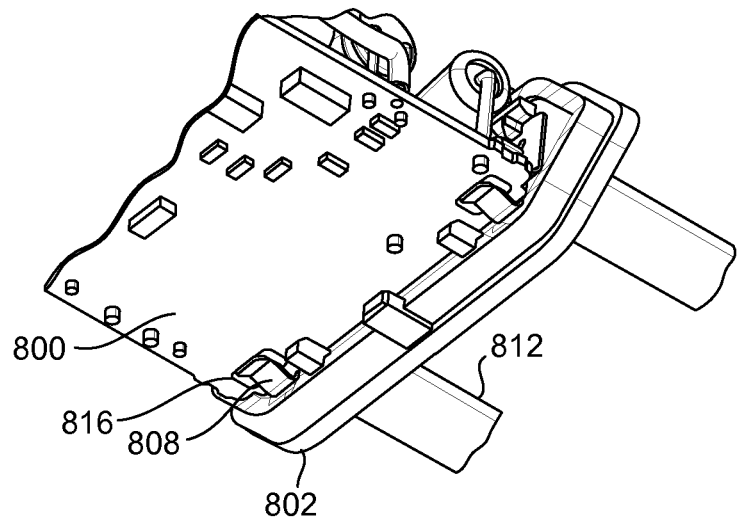

FIGS. 8A and 8B are partial perspective views illustrating attachment of a printed circuit board 800 to a removable cap 802 of a device housing according to one embodiment of the invention. More particularly, FIG. 8A is a partial side perspective view of an assembly within the device housing, and FIG. 8B is a partial bottom perspective view of the assembly illustrated in FIG. 8A. The illustrations in FIGS. 8A and 8B are shown with the device housing (e.g., device housing 502) removed. A metal clip 804 is affixed to the removable cap 802. The metal clip 804 is, for example, the metal clip 600 illustrated in FIGS. 6A-6D. The metal clip 600 includes a clip portion having first and second upper flexures 806 and a lower flexure 808. The metal clip 804 attaches to the printed circuit board 800 by receiving the printed circuit board 800 between the upper flexures 806 and the lower flexure 808, thereby establishing mechanical and electrical interconnection of the printed circuit board 800 and the removable cap 802. An internal feature 810 can serve to align and secure the metal clip 804 with respect to the inner surface of the removable cap 802. The removable cap 802 has at least one external plug 812 having an internal conductive post 814 (or pin) that extends through the external plug 812 and has an inner exposed end of the internal conductive post 814. The metal clip 804 includes an opening for receiving and securing itself to the inner exposed end. When the inner exposed end of the internal conductive post 814 is provided in the opening to the metal clip 804, the internal conductive post 814 is electrically connected to the printed circuit board 800 via the metal clip 804. When the printed circuit board 800 is received between the upper flexures 806 and the lower flexure 808, solder pads or traces 816 provided on the surface of the printed circuit board 800 can be adjacent the corresponding flexure, thereby providing electrical interconnection. By subsequently removing the removably cap 802 from its device housing, the printed circuit board 800 can be separated from the removable cap 802 without disassembly of soldered electrical connections, which facilitates maintenance and repair of the assembled electronic device.

The various aspects, features, embodiments or implementations of the invention described above can be used alone or in various combinations.

The advantages of the invention are numerous. Different embodiments or implementations may, but need not, yield one or more of the following advantages. One advantage of certain embodiments of the invention is that high density electronic device assemblies can be formed and used within compact electronic device housings. Another advantage of certain embodiments of the invention is that substrate arrangements, metal clips, and/or removable housing portions can be used in forming high density electronic device assemblies and/or compact electronic device housings.

The many features and advantages of the present invention are apparent from the written description. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. An electronic device, comprising:
a housing having at least one opening;
an electrical connector accessible from the opening in said housing, wherein the electrical connector has a plurality of sides; and
a printed circuit board assembly comprising a plurality of printed circuit boards having a plurality of electrical components coupled thereto, said printed circuit board assembly being provided within said housing and being electrically connected to said electrical connector, and said printed circuit board assembly being configured adjacent to a plurality of sides of said electrical connector, wherein said printed circuit board assembly has at least three sides that are each defined by a different one of the plurality of printed circuit boards and that are arranged to be adjacent to one of the sides of said electrical connector and a fourth side defined by one of the printed circuit boards, wherein the fourth side is attached to the electrical connector, and wherein the printed circuit board assembly comprises a bracket extending between a first portion and a second portion of one of the plurality of printed circuit boards, wherein the bracket extends adjacent to one of the plurality of sides of said electrical connector.

2. An electronic device as recited in claim 1, wherein said electrical connector is a peripheral port connector.

3. An electronic device as recited in claim 1, wherein said electronic device is a power adapter.

4. An electronic device as recited in claim 1, wherein the printed circuit board assembly comprises a first and a second end, and the electrical connector is located at the first end of the printed circuit board assembly.

5. An electronic device as recited in claim 4, further comprising a plug located at the second end of the printed circuit board assembly.

6. An electronic device, comprising:
a housing having at least one opening;
an electrical connector accessible from the opening in said housing, wherein said electrical connector has a first side, a second side, a third side and a fourth side; and
a printed circuit board assembly comprising a plurality of printed circuit boards having a plurality of electrical components coupled thereto, said printed circuit board assembly being provided within said housing and being electrically connected to said electrical connector, and said printed circuit board assembly being configured adjacent to a plurality of sides of said electrical connector,
wherein said printed circuit board assembly has at least three sides that are each defined by a different one of the plurality of printed circuit boards and that are arranged to be adjacent to one of the sides of said electrical connector, wherein said printed circuit board assembly comprises:
a first printed circuit board provided adjacent the first side of said electrical connector;
a second printed circuit board provided adjacent the second side of said electrical connector;
a third printed circuit board provided adjacent the third side of said electrical connector;
a fourth printed circuit board provided adjacent the top side of said electrical connector, and wherein the fourth printed circuit board is smaller than the first printed circuit board.

7. An electronic device as recited in claim 6, wherein the printed circuit board assembly comprises a first and a second end, and the electrical connector is located at the first end of the printed circuit board assembly.

8. An electronic device as recited in claim 7, further comprising a plug located at the second end of the printed circuit board assembly.

9. An electronic device, comprising:
a housing having at least one opening;
an electrical connector accessible from the opening in said housing; and
a printed circuit board assembly having a plurality of electrical components coupled thereto, said printed circuit board assembly being provided within said housing and being electrically connected to said electrical connector, and said printed circuit board assembly being configured adjacent to a plurality of sides of said electrical connector,
wherein said electrical connector has a top side, a bottom side, a left side and a right side, and
wherein said printed circuit board assembly comprises:
a bottom printed circuit board attached to the electrical connector;

a bracket extending between a first portion and a second portion of the bottom printed circuit board, wherein the bracket extends adjacent to the bottom side of said electrical connector;
a first side printed circuit board provided adjacent the left side of said electrical connector;
a second side printed circuit board provided adjacent the right side of said electrical connector; and
a top printed circuit board provided adjacent the top side of said electrical connector.

10. An electronic device as recited in claim 9, wherein said top printed circuit board is physically and electrically connected to said first side printed circuit board and said second side printed circuit board, and wherein said bottom printed circuit board is physically and electrically connected to said first side printed circuit board and said second side printed circuit board.

11. An electronic device as recited in claim 9, wherein the first side printed circuit board and the second side printed circuit board are the same size.

12. An electronic device as recited in claim 9, wherein the printed circuit board assembly comprises a first and a second end, and the electrical connector is located at the first end of the printed circuit board assembly.

13. An electronic device as recited in claim 10, wherein said top printed circuit board is electrically connected to said bottom printed circuit board through at least one of said first side printed circuit board or said second side printed circuit board.

14. An electronic device as recited in claim 11, wherein the top printed circuit board is larger than the first and second side printed circuit boards.

15. An electronic device as recited in claim 12, further comprising a plug located at the second end of the printed circuit board assembly.

16. An electronic device as recited in claim 14, wherein the bottom printed circuit board is larger than the top printed circuit board.

* * * * *